United States Patent [19]

Smith

[11] Patent Number: 4,527,078

[45] Date of Patent: Jul. 2, 1985

[54] SIGNAL TRANSLATOR WITH SUPPLY VOLTAGE COMPENSATION PARTICULARLY FOR USE AS INTERFACE BETWEEN CURRENT TREE LOGIC AND TRANSISTOR-TRANSISTOR LOGIC

[75] Inventor: Douglas D. Smith, Puyallup, Wash.

[73] Assignee: Signetics Corporation, Sunnyvale, Calif.

[21] Appl. No.: 410,225

[22] Filed: Aug. 23, 1982

[51] Int. Cl.³ ............... H03K 19/092; H03K 19/003; H03K 17/14

[52] U.S. Cl. ............................. 307/475; 307/456; 307/443; 307/297

[58] Field of Search ............... 307/475, 454, 455, 456, 307/491, 494, 359, 310, 443, 351, 254, 264, 297

[56] References Cited

U.S. PATENT DOCUMENTS

| | | | |
|---|---|---|---|
| 3,778,640 | 12/1973 | Platt et al. | 307/254 |
| 3,974,402 | 8/1976 | Fett et al. | 307/475 |
| 3,986,045 | 12/1976 | Lutz | 307/475 |

Primary Examiner—Stanley D. Miller
Assistant Examiner—David R. Bertelson
Attorney, Agent, or Firm—R. J. Meetin; R. T. Mayer; T. A. Briody

[57] ABSTRACT

A signal translator for converting an input voltage ($V_I$) into an output voltage ($V_O$) at a different level contains a primary element stack (10) and a similarly-configured image element stack (12), both coupled between the sources of a potentially variable first supply voltage ($V_{CC}$) and a normally constant second supply voltage ($V_{EE}$). A reference voltage ($V_R$) is supplied to both a primary-stack transistor (Q2) which provides the output voltage and an image-stack transistor (Q4) which provides a feedback signal ($V_F$). A feedback circuit (14) formed with an amplifier (16) and a shifting circuit (18) responds to the feedback signal to supply the reference voltage at such a value as to compensate the output voltage for changes in the first supply voltage relative to the second supply voltage. The translator is particularly useful for CTL-to-TTL conversion.

21 Claims, 2 Drawing Figures

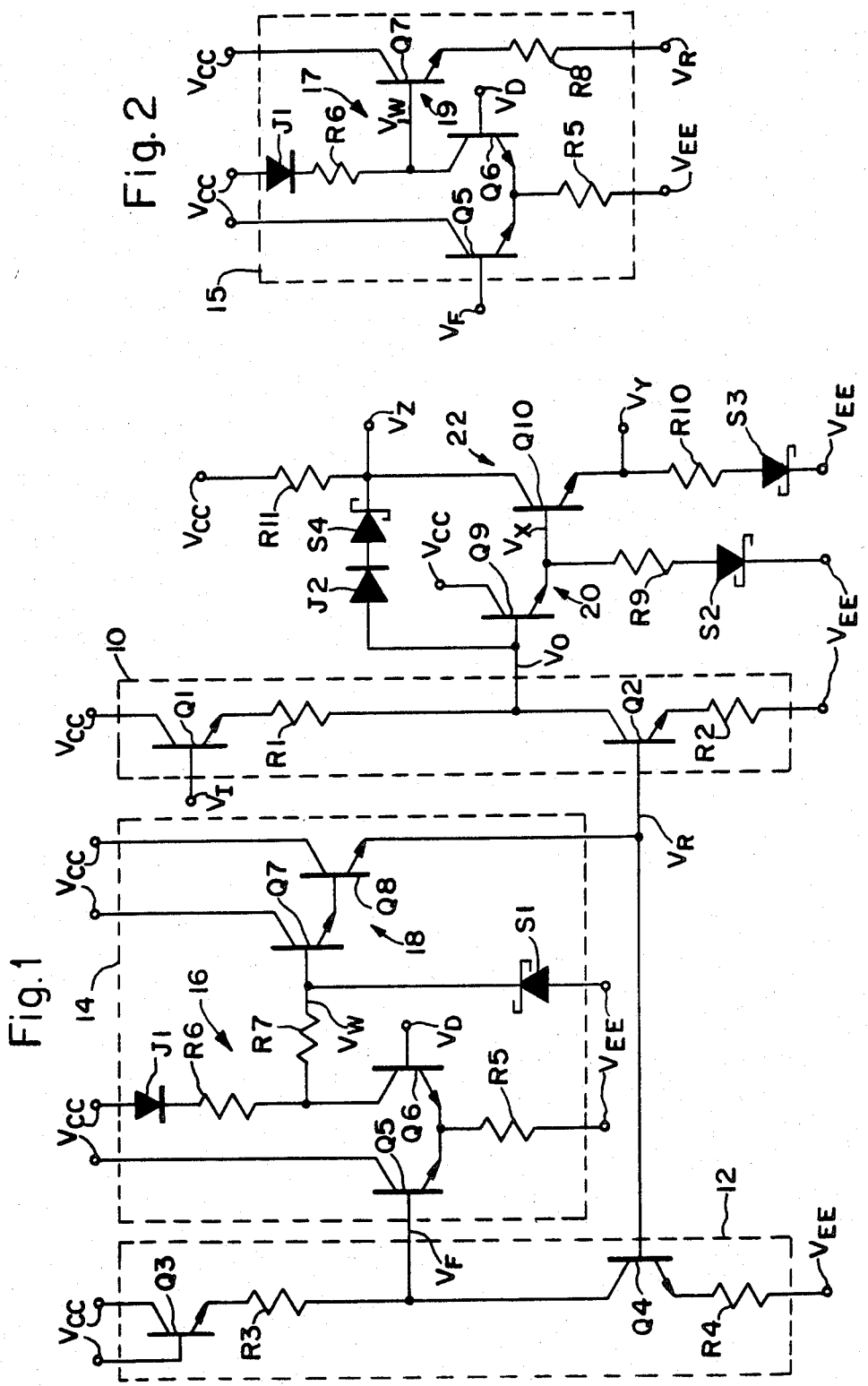

SIGNAL TRANSLATOR WITH SUPPLY VOLTAGE COMPENSATION

FIELD OF USE

This invention relates generally to signal translators suitable for semiconductor integrated circuits and more particularly to such a translator that converts an input voltage at a given voltage level into an output voltage at a different voltage level.

BACKGROUND ART

In some conventional signal translators, an element stack having two or more bipolar transistors serially coupled to one another between a first voltage supply and a lower-value second voltage supply is used to perform voltage translation. S. Platt et al disclose such a translator in U.S. Pat. No. 3,778,640, "Signal Voltage Level Translating Circuit". In this translator, an input voltage supplied to the base of a first NPN transistor in a primary stack is converted into an output voltage at a lower voltage level taken from the collector of a second NPN transistor in the stack. A first resistor is connected between the emitter of the first transistor and the collector of the second transistor. The collector of the first transistor is tied to the first voltage supply, while the emitter of the second transistor is tied to the second voltage supply.

A reference current source supplies a first reference voltage to the base of the second transistor to control the amount of downward voltage translation. The reference source contains an image stack consisting of a third NPN transistor, a second resistor, and a fourth NPN transistor connected to one another in the same manner as the first transistor, the first resistor, and the second transistor, respectively. A second reference voltage is supplied to the base of the third transistor. The collector of the fourth transistor is tied back to its base from which the first reference voltage is provided. The resistors have substantially the same resistance.

During operation, all of the transistors are conductive. When the input voltage equals the second reference voltage, the output voltage is at a selected nominal value below the input voltage. Because the bases of the second and fourth transistors are connected together and their emitters are tied directly to the second voltage supply, the current through the second transistor equals the current through the fourth transistor. Accordingly, a change in the input voltage above or below the second reference voltage results in the same change in the output voltage.

This translator provides linear voltage translation. However, the first reference voltage does not vary with the first supply voltage since it does not affect the base-to-emitter voltage of the fourth transistor. As a consequence, the output voltage changes as the first supply voltage varies. This is undesirable in some applications.

DISCLOSURE OF THE INVENTION

In accordance with the invention, a signal translator which converts an input voltage signal into an output voltage signal at a different voltage level and which is coupled between a source of a first supply voltage that may vary and a source of a second supply voltage that is normally substantially constant provides compensation in the output signal for changes in the first supply voltage.

In one aspect of the invention, the translator contains a pair of element stacks individually coupled between the supply voltage sources. The stacks are referred to as the primary stack and the image stack. The primary stack has a plurality of serially coupled primary elements, each of which is a transistor or an impedance element such as a resistor. One primary element is a first transistor that receives the input signal. Another primary element is a second transistor that receives a reference voltage and provides the output signal. The image stack has a group of image elements corresponding to the primary elements and configured in the same manner. The image transistor corresponding to the second transistor also receives the reference voltage. A feedback circuit responsive to a feedback signal provided from the image transistor supplies the reference voltage at such a value as to compensate for changes in the first supply voltage.

In another aspect of the invention, each transistor is a bipolar device. The input signal is provided to the base of the first transistor. Its emitter is coupled to the first supply voltage source. The collector of the second transistor provides the output signal and is coupled through a first impedance element in the primary stack to the emitter of the first transistor. The polarity of these two transistors is the same. A second impedance element is coupled between the emitter of the second transistor and the second supply voltage source. In this aspect of the invention, the translator has a reference circuit for providing the reference voltage to the base of the second transistor so as to achieve the specified voltage compensation.

The reference circuit in the second aspect preferably contains the image stack and the feedback circuit. The image stack contains a third transistor whose collector is coupled to the first supply voltage source. The image transistor is a fourth transistor whose base receives the reference voltage and whose collector provides the feedback voltage. The transistors in the image stack are of the same polarity as those in the primary stack. A third impedance element is coupled between the emitter of the third transistor and the collector of the fourth transistor. A fourth impedance element is coupled between the emitter of the fourth transistor and the second supply voltage source. The feedback circuit varies the reference voltage in the same direction as the first supply voltage varies.

The feedback circuit optimally contains an amplifier which generates an internal signal from the feedback signal. In particular, the amplifier is a differential amplifier which amplifies the difference between the feedback signal and another reference voltage to generate the internal signal. A shifting circuit then adjusts the voltage of the internal signal to convert it into the first reference voltage.

Each element in the image stack is desirably identical to the corresponding element in the primary stack. By use of this matching in combination with an appropriate choice of values for the feedback elements, the variance in the output signal from its nominal voltage at a given input signal is less than 1 percent of the variance in the first supply voltage from its nominal value over the temperature range of $-55°$ C. to $125°$ C.

None of the transistors normally go into saturation. Because of this and the nature of the feedback, the present translator has a relatively fast switching speed. The translator characteristics are also stable over temperature.

In a typical application, the input voltage is at one of the binary levels for current tree logic (CTL) which is similar to emitter-coupled logic (ECL) but runs with different voltage levels and swings. CTL uses a swing of $1V_{BE}$ referenced to the first supply voltage, where $V_{BE}$ is the standard base-to-emitter voltage for a bipolar transistor when its base-emitter junction is conductively forward biased. The output voltage is at one of the binary levels for transistor-transistor logic (TTL).

BRIEF DESCRIPTION OF THE DRAWING

FIG. 1 is a circuit diagram of an embodiment of a signal translator in accordance with the invention.

FIG. 2 is a circuit diagram of a feedback circuit alternatively employable in the embodiment of FIG. 1.

Like reference symbols are employed in the drawing and in the description of the preferred embodiments to represent the same or very similar item or items.

DESCRIPTION OF THE PREFERRED EMBODIMENTS

Referring to the drawing, FIG. 1 illustrates an embodiment of a CTL-to-TTL bipolar signal translator that operates between a source of a high supply voltage $V_{CC}$ and a source of a low supply voltage $V_{EE}$. Supply voltage $V_{CC}$ has a nominal value $V_{CC0}$ of 5.0 volts but may vary from 4.5 volts to 5.5 volts. Supply voltage $V_{EE}$ is ground reference (0 volt) and does not vary to any significant degree.

This translator has a primary element stack 10 containing an always-on NPN transistor Q1 whose base receives a CTL input voltage signal $V_I$ and an always-on NPN transistor Q2 whose collector supplies a TTL output voltage signal $V_O$ at a different voltage level. The switching point for input voltage $V_I$ is $V_{CC}$-0.5 $V_{BE}$ where $V_{BE}$ is about 0.8 volt for an NPN transistor at room temperature. The nominal logical "1" value for voltage $V_I$ is $V_{CC}$. The nominal $V_I$ logical "0" value lies in the range of $V_{CC}$-2 $V_{BE}$ to $V_{CC}$-$V_{BE}$ and typically is $V_{CC}$-1.5 $V_{BE}$. The corresponding switching point for output voltage $V_O$ is 3 $V_{BE}$. The nominal $V_O$ logical "1" level is 3.5 $V_{BE}$, while the nominal $V_O$ logical "0" level lies in the range of 1.5 $V_{BE}$ to 2.5 $V_{BE}$ and typically is 2 $V_{BE}$.

The collector of transistor Q1 is connected to the $V_{CC}$ supply at the top of stack 10 which also contains resistors R1 and R2. Resistor R1 is connected between the emitter of transistor Q1 and the collector of transistor Q2. Resistor R2 is connected between the emitter of transistor Q2 and the $V_{EE}$ supply. Resistors R1 and R2 are 4,000 ohms and 500 ohms, respectively.

A voltage reference circuit supplies a reference voltage $V_R$ to the base of transistor Q2. The nominal $V_R$ level is 1.5 $V_{BE}$. As supply voltage $V_{CC}$ changes, voltage $V_R$ likewise changes in the same (positive/negative) direction by an appropriate amount to compensate for the $V_{CC}$ change so as to keep voltage $V_O$ relatively constant. For either the nominal $V_O$ logical "1" or "0" value, the variance in voltage $V_O$ from its nominal value is less than 1% of the variance in voltage $V_{CC}$ from its nominal value over the temperature range of $-55°$ C. to $125°$ C.

The reference circuit contains an image element stack 12 and a feedback circuit 14 that supplies voltage $V_R$ to both stacks 10 and 12 in response to a feedback voltage $V_F$ supplied from image stack 12. Always-on NPN transistors Q3 and Q4 and resistors R3 and R4 form stack 12 and are serially connected to one another between the $V_{CC}$ and $V_{EE}$ supplies in the same manner as transistors Q1 and Q2 and resistors R1 and R2 are respectively connected to one another in stack 10. In addition, each element Q3, Q4, R3, or R4 in stack 12 is substantially identical to the corresponding element Q1, Q2, R1, or R2 in stack 10. Transistor Q3 is arranged as a diode with its base connected to the $V_{CC}$ supply. Resistor R4 in combination with sister resistor R2 provides the voltage drop that enables voltage $V_R$ to be at its nominal level above 1 $V_{BE}$. Voltage $V_F$ is taken from the collector of transistor Q4 whose base is connected to the base of transistor Q2 so as to receive voltage $V_R$.

Feedback circuit 14 consists of a differential amplifier 16 responsive to voltage $V_F$ for generating an internal voltage signal $V_W$ and a level shifting circuit 18 for converting voltage $V_W$ into voltage $V_R$. Differential amplifier 16 includes a pair of always-on NPN transistors Q5 and Q6 whose emitters are connected to each other and through a resistor R5 to the $V_{EE}$ supply. The current gain (beta) of each transistor Q5 or Q6 is 60, while resistor R5 is 1,500 ohms. Voltage $V_F$ is supplied to the base of transistor Q5 whose collector is tied to $V_{CC}$ supply. A reference voltage $V_D$ of 3.5 $V_{BE}$ is supplied to the base of transistor Q6. The collector of transistor Q6 is coupled through a resistor R6 and a PN diode J1 to the $V_{CC}$ supply. Resistor R6 is 2,400 ohms. Diode J1 acts to keep the gain of amplifier 16 at the desired level. The collector of transistor Q6 is also connected through a resistor R7 and a Schottky diode S1 to the $V_{EE}$ supply. Resistor R7 is 20,000 ohms. Voltage $V_W$ is taken from the common junction of resistor R7 and diode S1 which together act to control the gain in the feedback loop at high frequency.

Shifting circuit 18 contains always-on NPN transistors Q7 and Q8 whose base-emitter junctions are serially coupled between the collector of transistor Q6 by way of resistor R7 on one hand and the bases of transistors Q2 and Q4 on the other hand so as to shift voltage $V_W$ about 2 $V_{BE}$ downward into voltage $V_R$. Although the collectors of transistors Q7 and Q8 are tied to the $V_{CC}$ supply, they basically act as diodes. Their collectors could alternatively be tied back to their respective bases.

Primary stack 10 interacts with image stack 12 and feedback circuit 14 as follows. Any changes in stack 10 caused by a $V_{CC}$ change are duplicated in stack 12 because it is identical to stack 10. The changes in stack 12 appear in voltage $V_F$ which corresponds to voltage $V_O$. Circuit 14 responds to the change in voltage $V_F$ from its nominal value at voltage $V_D$ by suitably adjusting voltage $V_R$ so as to return voltage $V_F$ to its nominal $V_D$ value. The $V_R$ value needed to maintain voltage $V_F$ at its nominal value is the same as that needed to maintain voltage $V_O$ at its nominal "1" or "0" value. Thus, the feedback to stabilize stack 12 against $V_{CC}$ changes also serves to stabilize stack 10 against $V_{CC}$ changes.

More particularly, it is assumed that the current through transistor Q4 does not change at the instant that voltage $V_{CC}$ first changes from its nominal value $V_{CC0}$ to a new value $V_{CC0}+\Delta V_{CC}$ where $\Delta V_{CC}$ may be positive or negative. Feedback voltage $V_F$ then initially changes by the same amount $\Delta V_{CC}$. This unbalances amplifier 16 and causes voltage $V_W$ to change by a much greater amount $\Delta V_W$ determined by the differential amplifier gain which is a function of the change in current through transistor Q6 multiplied by the R6/R5 resistance ratio. When $\Delta V_{CC}$ is positive, $\Delta V_W$ is positive; likewise, when $\Delta V_{CC}$ is negative, $\Delta V_W$ is negative.

Circuit 18 then shifts voltage $V_W$ downward by 2 $V_{BE}$ so that voltage $V_R$ changes by an amount $\Delta V_W$ which, again, is in the same direction as $\Delta V_{CC}$.

The $\Delta V_W$ change in voltage $V_R$ then causes the currents through transistors Q2 and Q4 to increase or decrease depending on whether $\Delta V_{CC}$ is positive or negative. If $\Delta V_{CC}$ is positive, transistor Q4 becomes more conductive. The collector-to-emitter voltage of transistor Q4 decreases by an amount greater than the amount by which the voltage across resistor R4 increases due to the greater current through transistor Q4. This brings voltage $V_F$ back down to its nominal level. The opposite occur when $\Delta V_{CC}$ is negative; transistor Q4 becomes less conductive so as to force voltage $V_F$ back up to its nominal level. Substantially the same changes occur in stack 10 so as to stabilize voltage $V_O$ at its nominal "1" or "0" value.

Turning to FIG. 2, it shows an embodiment of a feedback circuit 15 alternatively employable in the translator of FIG. 1. Circuit 15 consists of a differential amplifier 17 and a shifting circuit 19. Amplifier 17 has elements Q5, Q6, R5, R6, and J1 all configured the same as in amplifier 16 of FIG. 1. The difference between circuits 14 and 15 is that elements R7 and S1 are absent in amplifier 17 and transistor Q8 is absent in shifting circuit 19. Instead, the collector of transistor Q6 is directly connected to the base of transistor Q7 whose emitter is coupled through a resistor R8 to provide voltage $V_R$ to the bases of transistors Q2 and Q4. The value of resistor R8 is optimally chosen to provide a voltage drop of 1 $V_{BE}$ so that shifting circuit 19 shifts voltage $V_W$ about 2 $V_{BE}$ downward into voltage $V_R$. Resistor R8 acts to control the gain in the feedback loop at high frequency.

Returning to FIG. 1, output voltage $V_O$ is supplied to an always-on buffer NPN transistor Q9 in a buffer circuit 20 of the translator. The collector of transistor Q9 is tied to the $V_{CC}$ supply. A 3,000-ohm resistor R9 and a Schottky diode S2 in circuit 20 are serially connected between the $V_{EE}$ supply and the emitter of transistor Q9. Its emitter provides a further translator TTL output voltage signal $V_X$ which is shifted down 1 $V_{BE}$ from voltage $V_O$.

Voltage $V_X$ is then supplied to the base of a phase-splitting NPN transistor Q10 in a TTL output stage 22 partly shown in FIG. 1. The emitter of switching transistor Q10 supplies a voltage $V_Y$ and is coupled through a 500-ohm resistor R10 and a Schottky diode S3 in stage 22 to the $V_{EE}$ supply. The collector of transistor Q10 supplies a voltage $V_Z$ and is connected through a 2,500-ohm resistor R11 in stage 22 to the $V_{CC}$ supply. A PN diode J2 and a Schottky diode S4 in stage 22 are serially connected in the forward direction between the base of transistor Q9 and the collector of transistor Q10. In operation, diode J2 is conductive when voltage $V_O$ is at logical "1". A 1 $V_{BE}$ voltage drop then occurs across both diode J2 and the base-emitter junction of transistor Q9. Insofar as transistor Q10 is concerned, these two 1 $V_{BE}$ drops cancel each other, so that diode S4 is effectively connected between the base and collector of transistor Q10. That is, the combination of transistor Q9 and diodes J2 and S4 effectively acts to Schottky clamp transistor Q10 so as to keep it out of deep saturation. This is advantageous since it increases switching speed. The remaining unshown portion of stage 22 operates on voltages $V_Y$ and $V_Z$ in a generally conventional manner and is of a conventional totem pole design.

Methods for manufacturing the various elements of the present translator are well known in the semiconductor art. The translator is preferably manufactured as a monolithic integrated circuit according to conventional planar processing techniques using oxide isolation to separate active regions on a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results except that most of the Schottky diodes would be deleted or replaced with appropriate PN diodes; in this case, $V_{BE}$ is negative in value. Some or all of the transistors might be field-effect transistors (FET's) such as insulated-gate FET's or junction FET's. Thus, various modifications, changes, and applications may be made by those skilled in the art without departing from the true scope and spirit of the invention as defined by the appended claims.

What I claim is:

1. A signal translator for converting an input voltage signal into an output voltage signal at a different voltage level in which: a primary element stack coupled between a source of a first supply voltage and a source of a second supply voltage has a plurality of serially coupled primary elements, each being a transistor or an impedance element of which a first transistor receives the input signal and a second transistor receives a reference voltage and provides the output signal; an image element stack coupled between the sources has a like plurality of image elements that correspond on a one-to-one basis to the primary elements and are configured the same as them; and the image transistor corresponding to the second transistor receives the reference voltage; characterized by feedback means comprising:
    an amplifier responsive to a feedback signal provided from the image transistor for generating an internal signal; and
    shifting means for adjusting the voltage level of the internal signal to convert it into the reference voltage at such a value as to compensate in the output signal for changes in the first supply voltage relative to the second supply voltage.

2. A translator as in claim 1 characterized in that the image stack is substantially identical to the primary stack.

3. A translator as in claim 2 characterized by means for providing the image transistor corresponding to the first transistor with a control voltage that differs by a substantially constant amount from the first supply voltage, the input signal being defined relative to the first supply voltage.

4. A signal translator for converting an input voltage signal into an output voltage signal at a different voltage level in which: there are first, second, third, and fourth like-polarity bipolar transistors, each having a base, an emitter, and a collector; there is a pair of substantially identical impedance elements, of which one is coupled between the emitter of the first transistor and the collector of the second transistor in a primary element stack and the other is coupled between the emitter of the third transistor and the collector of the fourth transistor in an image element stack; the base of the first transistor receives the input signal; the collector of the second transistor provides the output signal; the first and third transistors which are substantially identical have their collectors coupled to a source of a first supply voltage; the second and fourth transistors which are substantially identical have their emitters coupled to a source of a second supply voltage; and the bases of the second and fourth transistors are responsive to a reference voltage; characterized by:

a further pair of substantially identical impedance elements, of which one is coupled between the emitter of the second transistor and the source of a second supply voltage and the other is coupled between the emitter of the fourth transistor and the source of the second supply voltage; and feedback means responsive to a feedback signal at the collector of the fourth transistor for generating the reference voltage at a value that varies in the same direction that the first supply voltage varies relative to the second supply voltage so as to compensate in the output signal for changes in the first supply voltage relative to the second supply voltage, the feedback means comprising (a) an amplifier responsive to the feedback signal for generating an internal signal and (b) shifting means for adjusting the voltage level of the internal signal to convert it into the reference voltage.

5. A translator as in claim 4 characterized by means for maintaining a specified substantially constant voltage between the base of the third transistor and the source of the first supply voltage, the input signal being defined relative to the first supply voltage.

6. A translator as in claim 5 characterized in that the specified voltage is substantially zero, the third transistor being diode connected.

7. A signal translator for converting an input voltage signal into an output voltage signal at a different voltage level in which: there are first, second, third, and fourth like-polarity bipolar transistors, each having a base, an emitter, and a collector; the base of the first transistor receives the input signal; the collector of the second transistor provides the output signal; an impedance element is coupled between the emitter of the first transistor and the collector of the second transistor; an impedance element is coupled between the emitter of the third transistor and the collector of the fourth transistor; the first and third transistors have their collectors coupled to a source of a first voltage supply; and the second and fourth transistors whose bases respond to a reference voltage have their emitters coupled to a source of a second supply voltage; characterized by:

an impedance element coupled between the emitter of the second transistor and the source of the second supply voltage;

an impedance element coupled between the emitter of the fourth transistor and the source of the second supply voltage;

means for directly connecting the base and collector of the third transistor, the input signal being defined relative to the first supply voltage; and feedback means responsive to a feedback signal at the collector of the fourth transistor for generating the reference voltage at a value that varies in the same direction that the first supply voltage varies relative to the second supply voltage so as to compensate in the output signal for changes in the first supply voltage relative to the second supply voltage, the feedback means comprising (a) an amplifier responsive to the feedback signal for generating an internal signal and (b) shifting means for adjusting the voltage level of the internal signal to convert it into the reference voltage.

8. A translator as in claim 3, 5, 6, or 7 characterized in that the second supply voltage is substantially constant.

9. A translator as in claim 3, 5, 6, or 7 characterized in that the amplifier is a differential amplifier which amplifies the difference between the feedback signal and a second reference voltage to generate the internal signal.

10. A translator as in claim 9 characterized in that the second reference voltage is defined relative to the second supply voltage.

11. A translator as in claim 5 or 7 characterized in that the variance in the output signal from its nominal voltage is less than 1 percent of the variance in the first supply voltage from its nominal value for a given value of the input signal over the temperature range of $-55°$ C. to $125°$ C.

12. A translator as in claim 11 characterized in that the transistors are NPN transistors.

13. A translator as in claim 5 or 7 characterized in that each impedance element is a resistor.

14. A translator as in claim 5 or 7 characterized by a like-polarity buffer bipolar transistor having an emitter for providing a further output signal, a base for receiving the output signal, and a collector coupled to the source of the first supply voltage.

15. An electronic circuit characterized by a combination of the translator of claim 14 and an output stage in which: a like-polarity phase-splitting bipolar transistor has an emitter coupled to the source of the second supply voltage, a base for receiving the further output signal, and a collector coupled to the source of the first supply voltage; and a pair of diodes of which one is a PN diode and the other is a Schottky diode are connected in series between the base of the buffer transistor and the collector of the phase-splitting transistor so as to clamp it out of deep saturation.

16. A signal translator for converting an input signal into an output signal at a different voltage level in which: there are first, second, third, and fourth like-polarity transistors, each having first and second flow electrodes and a control electrode for regulating current transmission between the flow electrodes; the control electrode of the first transistor receives the input signal; the second electrode of the second transistor provides the output signal; an impedance element is coupled between the first electrode of the first transistor and the second electrode of the second transistor; an impedance element is coupled between the first electrode of the third transistor and the second electrode of the fourth transistor; the first and third transistors have their second electrodes coupled to a source of a first supply voltage; and the second and fourth transistors whose control electrodes respond to a common reference voltage have their first electrodes coupled to a source of a second supply voltage; characterized by:

means for maintaining a specified substantially constant voltage between the control electrode of the third transistor and the source of the first supply voltage, the input signal being defined relative to the first supply voltage; and feedback means responsive to a feedback signal at the second electrode of the fourth transistor for providing the common reference voltage at such a value as to compensate in the output signal for changes in the first supply voltage relative to the second supply voltage.

17. A translator as in claim 16 characterized in that the feedback means generates the common reference voltage by amplifying the voltage difference between the feedback signal and a further reference signal.

18. A translator as in claim 17 characterized in that the further reference signal is defined relative to the second supply voltage.

19. A translator as in claim 17 characterized in that the feedback means comprises:
- a differential amplifier for amplifying the voltage difference between the feedback signal and the further reference signal to generate an internal signal; and
- shifting means for adjusting the voltage level of the internal signal to convert it into the common reference voltage.

20. A translator as in claim 17 characterized by:
- an impedance element coupled between the first electrode of the second transistor and the source of the second supply voltage; and
- an impedance element coupled between the first electrode of the fourth transistor and the source of the second supply voltage.

21. A translator as in claim 17 characterized in that the specified voltage is substantially zero, the third transistor being connected as a diode.

* * * * *